(12) United States Patent
Tan et al.

(10) Patent No.: US 12,132,055 B2
(45) Date of Patent: Oct. 29, 2024

(54) ARRAY SUBSTRATE AND DISPLAY PANEL

(71) Applicant: SHENZHEN CHINA STAR OPTOELECTRONICS SEMICONDUCTOR DISPLAY TECHNOLOGY CO., LTD., Shenzhen (CN)

(72) Inventors: Ruifa Tan, Shenzhen (CN); Tianhong Wang, Shenzhen (CN); Xiaohui Yao, Shenzhen (CN)

(*) Notice: Subject to any disclaimer, the term of this patent is extended or adjusted under 35 U.S.C. 154(b) by 0 days.

(21) Appl. No.: 17/762,115

(22) PCT Filed: Mar. 17, 2022

(86) PCT No.: PCT/CN2022/081415
§ 371 (c)(1),
(2) Date: Mar. 21, 2022

(87) PCT Pub. No.: WO2023/155261
PCT Pub. Date: Aug. 24, 2023

(65) Prior Publication Data
US 2024/0047470 A1 Feb. 8, 2024

(30) Foreign Application Priority Data
Feb. 17, 2022 (CN) .......................... 202210163774.0

(51) Int. Cl.
G02F 1/1368 (2006.01)
G02F 1/1343 (2006.01)
H01L 27/12 (2006.01)

(52) U.S. Cl.
CPC ...... *H01L 27/124* (2013.01); *G02F 1/134309* (2013.01); *G02F 1/1368* (2013.01)

(58) Field of Classification Search
CPC ............. G02F 1/133514; G02F 1/1343; G02F 1/134309; G02F 1/13439; G02F 1/13606;
(Continued)

(56) References Cited

U.S. PATENT DOCUMENTS

2007/0002229 A1 1/2007 Lee
2015/0235599 A1* 8/2015 Cho .................... H01L 27/1222
345/206
(Continued)

FOREIGN PATENT DOCUMENTS

CN 101055879 A 10/2007
CN 105589276 A 5/2016
(Continued)

*Primary Examiner* — Thoi V Duong

(57) ABSTRACT

The present application discloses an array substrate and a display panel. The array substrate includes a plurality of pixel units arranged in an array, each of the pixel units includes a thin film transistor. The thin film transistor includes a gate electrode and a drain electrode. A first overlap region and a non-overlap region is defined between the gate electrode and the drain electrode. The first overlap region is adjacent to the non-overlap region. A width of a cross section of the drain electrode in the first overlap region is less than a width of a cross section of the drain electrode in the non-overlap region. The array substrate can reduce a parasitic capacitor between the gate electrode and drain electrode.

18 Claims, 12 Drawing Sheets

(58) Field of Classification Search
CPC ............. G02F 1/1362; G02F 1/136286; G02F 1/1368; H01L 27/124; H01L 29/41733; H01L 29/786; H01L 29/41775
See application file for complete search history.

(56) References Cited

U.S. PATENT DOCUMENTS

| | | |
|---|---|---|
| 2019/0172844 A1 | 6/2019 | Su |
| 2020/0166792 A1 | 5/2020 | Huang |
| 2021/0336023 A1* | 10/2021 | Huang .............. H01L 29/42384 |

FOREIGN PATENT DOCUMENTS

| | | |
|---|---|---|
| CN | 105702683 A | 6/2016 |
| CN | 106992215 A | 7/2017 |
| CN | 208848908 U | 5/2019 |

* cited by examiner

ARRAY SUBSTRATE AND DISPLAY PANEL

FIELD OF INVENTION

The present application relates to a field of display technologies, especially to an array substrate and a display panel.

BACKGROUND OF INVENTION

At present, display panels mainly includes two categories: liquid crystal display panel and organic light emitting diode display panel. In display panel technologies, a thin film transistor is a core part of a display panel, and is manufactured on a substrate and arranged in an array as a switch device of a pixel unit of the display panel. The thin film transistor includes a gate electrode, a source electrode, a drain electrode, and an active layer. The source electrode and drain electrode are connected to an active layer. After a voltage is applied to the gate electrode, with an increasing gate electrode voltage, a surface of the active layer is changed from an exhausting layer to an electron accumulative layer to form a inverted layer. When becoming strongly inverted (namely, reaching a switch-on voltage), the active layer has carrier motion to implement conduction between the source electrode and the drain electrode. For a structure, according to a position of the gate electrode, the thin film transistor are classified generally into two structures which are a top gate and a bottom gate.

In the thin film transistor of the array substrate, a parasitic capacitor is formed between the gate electrode and the drain electrode to influence jump of pixel voltage and is an important factor affecting display quality. A size of the parasitic capacitor is proportional to an overlap area between the gate electrode and the drain electrode in the thin film transistor. In the conventional technologies, the parasitic capacitor between the gate electrode and the drain electrode of the thin film transistor is large to result in fluctuation of a pixel voltage during driving when applied to a liquid crystal display, which influences a display effect.

Thus, the present art urgently requires an array substrate and a display panel to reduce a parasitic capacitor between the gate electrode and the drain electrode of the thin film transistor to improve display effect.

SUMMARY OF INVENTION

Technical Issue

The present application provides an array substrate and a display panel that can reduce a parasitic capacitor between a gate electrode and a drain electrode of a thin film transistor and improve a display effect.

Technical Solution

In an aspect, the embodiment of the present application provides an array substrate, including a plurality of pixel units arranged in an array, wherein each of the pixel units including a thin film transistor, and the thin film transistor including a gate electrode and a drain electrode; and wherein a first overlap region and a non-overlap region are defined between the gate electrode and the drain electrode, the first overlap region is located adjacent to the non-overlap region, and a width of a cross section of the drain electrode located in the first overlap region is less than a width of a cross section of the drain electrode located in the non-overlap region.

Optionally, in some embodiments of the present application, a second overlap region is defined between the gate electrode and the drain electrode, and the second overlap region is located on a side of the first overlap region away from the non-overlap region.

Optionally, in some embodiments of the present application, a width of a cross section of the drain electrode located in the second overlap region is less than or equal to the width of the cross section of the drain electrode located in the first overlap region.

Optionally, in some embodiments of the present application, the width of the cross section of the drain electrode located in the first overlap region is less than a width of the cross section of the drain electrode located in the non-overlap region.

Optionally, in some embodiments of the present application, the width of the cross section of the drain electrode located in the first overlap region gradually decreases along a direction away from the non-overlap region.

Optionally, in some embodiments of the present application, the cross section of the drain electrode located in the first overlap region is square.

Optionally, in some embodiments of the present application, an area of the drain electrode located in the second overlap region is less than the area of the drain electrode located in the first overlap region.

Optionally, in some embodiments of the present application, a length of the cross section of the drain electrode located in the non-overlap region is greater than a length of the cross section of the drain electrode located in the first overlap region, and/or, the length of the cross section of the drain electrode located in the non-overlap region is greater than a length of the cross section of the drain electrode located in the second overlap region.

Optionally, in some embodiments of the present application, a length of the cross section of the drain electrode located in the non-overlap region is equal to a length of the cross section of the drain electrode located in the first overlap region and a length of the cross section of the drain electrode located in the second overlap region.

Optionally, in some embodiments of the present application, a thickness of the drain electrode located in the non-overlap region is greater than a thickness of the drain electrode located in the first overlap region.

Optionally, in some embodiments of the present application, a thickness of the gate electrode located in the first overlap region is less than a thickness of the gate electrode located in the second overlap region.

Optionally, in some embodiments of the present application, a thickness of the drain electrode located in the first overlap region is greater than a thickness of the drain electrode located in the second overlap region.

In another aspect, the present application provides a display panel, including a color filter substrate and an array substrate, wherein the color filter substrate and the array substrate are disposed oppositely, the array substrate includes a plurality of pixel units arranged in an array, each of the pixel units includes a thin film transistor, and the thin film transistor includes a gate electrode and a drain electrode; wherein a first overlap region and a non-overlap region are defined between the gate electrode and the drain electrode, the first overlap region is located adjacent to the non-overlap region, and a width of a cross section of the drain electrode located in the first overlap region is less than a width of a cross section of the drain electrode located in the non-overlap region.

Optionally, in some embodiments of the present application, a second overlap region is defined between the gate electrode and the drain electrode, and the second overlap region is located on a side of the first overlap region away from the non-overlap region.

Optionally, in some embodiments of the present application, a width of a cross section of the drain electrode located in the second overlap region is less than or equal to the width of the cross section of the drain electrode located in the first overlap region.

Optionally, in some embodiments of the present application, the width of the cross section of the drain electrode located in the first overlap region is less than a width of the cross section of the drain electrode located in the non-overlap region.

Optionally, in some embodiments of the present application, the width of the cross section of the drain electrode located in the first overlap region gradually decreases along a direction away from the non-overlap region.

Optionally, in some embodiments of the present application, the cross section of the drain electrode located in the first overlap region is square.

Optionally, in some embodiments of the present application, an area of the drain electrode located in the second overlap region is less than the area of the drain electrode located in the first overlap region.

Optionally, in some embodiments of the present application, a length of the cross section of the drain electrode located in the non-overlap region is greater than a length of the cross section of the drain electrode located in the first overlap region, and/or, the length of the cross section of the drain electrode located in the non-overlap region is greater than a length of the cross section of the drain electrode located in the second overlap region.

Optionally, in some embodiments of the present application, a length of the cross section of the drain electrode located in the non-overlap region is equal to a length of the cross section of the drain electrode located in the first overlap region and a length of the cross section of the drain electrode located in the second overlap region.

Optionally, in some embodiments of the present application, a thickness of the drain electrode located in the non-overlap region is greater than a thickness of the drain electrode located in the first overlap region.

Optionally, in some embodiments of the present application, a thickness of the gate electrode located in the first overlap region is less than a thickness of the gate electrode located in the second overlap region.

Optionally, in some embodiments of the present application, a thickness of the drain electrode located in the first overlap region is greater than a thickness of the drain electrode located in the second overlap region.

Advantages

The present application provides an array substrate and a display panel, the array substrate includes a plurality of pixel units arranged in an array. Each of the pixel units includes a thin film transistor; the thin film transistor includes a gate electrode and a drain electrode, wherein a first overlap region and a non-overlap region are defined between the gate electrode and the drain electrode. The first overlap region is located adjacent to the non-overlap region. A width of a cross section of the drain electrode located in the first overlap region is less than a width of a cross section of the drain electrode located in the non-overlap region. The array substrate of the present application reduces the area of the drain electrode located in the first overlap region, i.e., area of the drain electrode right facing the gate electrode, to reduce a parasitic capacitor between the gate electrode and the drain electrode of the thin film transistor to improve a display effect.

DESCRIPTION OF DRAWINGS

To more clearly elaborate on the technical solutions of embodiments of the present invention or prior art, appended figures necessary for describing the embodiments of the present invention or prior art will be briefly introduced as follows. Apparently, the following appended figures are merely some embodiments of the present invention. A person of ordinary skill in the art may acquire other figures according to the appended figures without any creative effort.

FIG. 1b is a top view of a thin film transistor of an array substrate in FIG. 1a;

FIG. 2b is a top view of the thin film transistor of the array substrate in FIG. 2a;

FIG. 3b is a top view of the thin film transistor of the array substrate in FIG. 3a;

FIG. 4b is the top view of a thin film transistor of the array substrate in FIG. 4a;

FIG. 5b is a top view of the thin film transistor of the array substrate in FIG. 5a.

REFERENCE NUMBER LIST

100/200/300/400/500 array substrate, 10 pixel units, 20 thin film transistor, 21 gate electrode, 22 drain electrode, 23 source electrode, 201 first overlap region, 202 non-overlap region, 203 second overlap region, 24 pixel electrode, 30 data lines, 40 scan lines, 600 display panel, 610 substrate, 620 gate electrode insulation layer, 630 semiconductor layer, 640 color filter substrate.

DETAILED DESCRIPTION OF PREFERRED EMBODIMENTS

The technical solution in the embodiment of the present application will be clearly and completely described below with reference to the accompanying drawings in the embodiments of the present application. Apparently, the described embodiments are merely some embodiments of the present application instead of all embodiments. According to the embodiments in the present application, all other embodiments obtained by those skilled in the art without making any creative effort shall fall within the protection scope of the present application.

The embodiment of the present application provides an array substrate and a display panel that can solve an issue of a parasitic capacitor generating vertical crosstalk to pixel units to result in abnormal display, which will be described respectively. It should be explained that the order of descriptions in the following embodiments is not to limit the preferred order of the embodiments. Furthermore, in descriptions of the present application, a terminology "include" means "including but it not limited to". Terminologies "first", "second", "third", etc., are only for marks for distinguishing different objects but are not for describing a specific sequence.

Figure 1A:
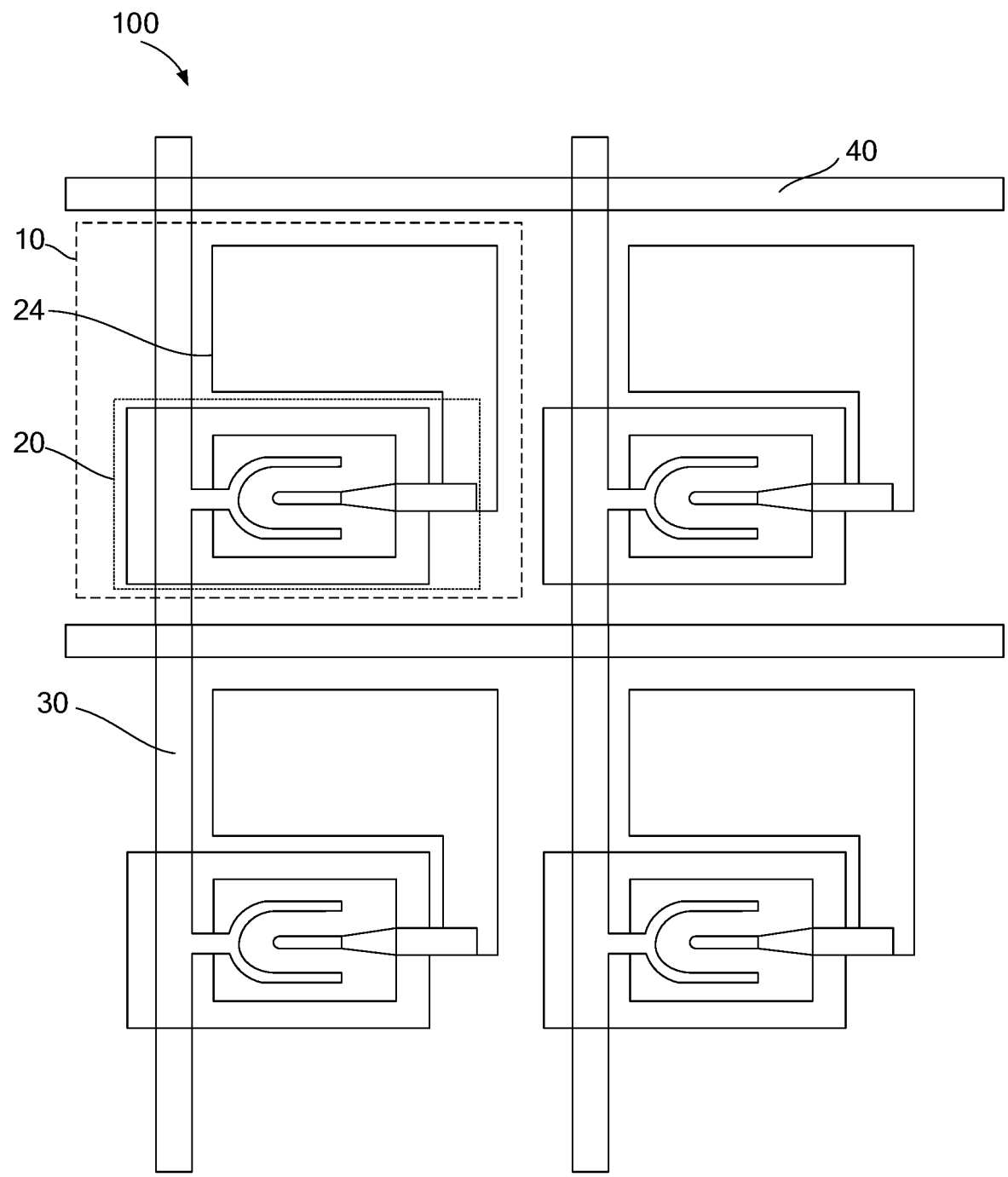
FIG. 1a is a top view of a first array substrate provided by an embodiment of the present application.
Figure 1B:
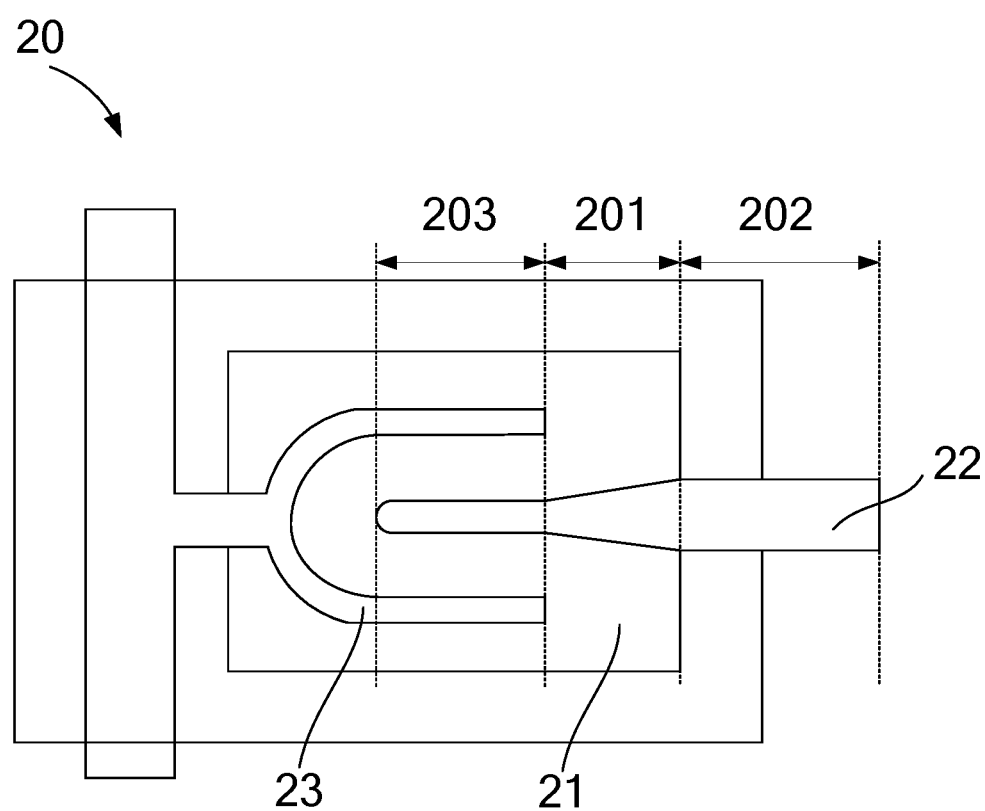
Figure 1C:
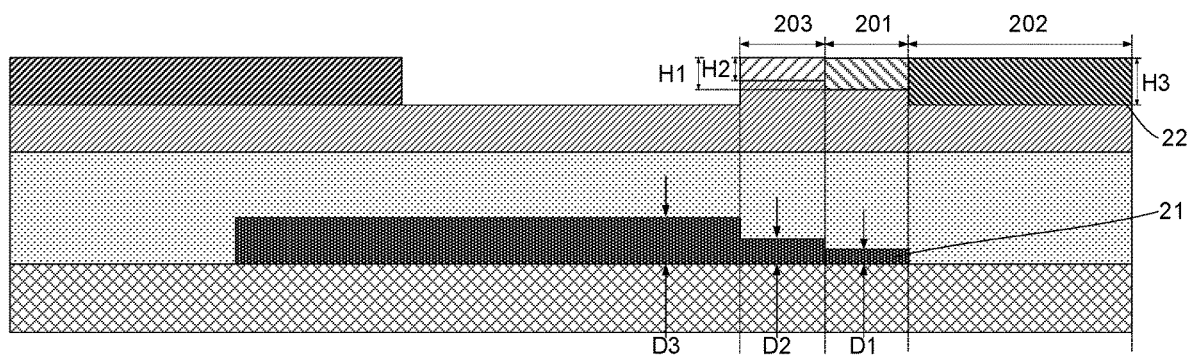
FIG. 1c is a cross-sectional view of the thin film transistor provided by the embodiment of the present application.

With reference to FIGS. 1a and 1b, FIG. 1a is a top view of a first array substrate provided by an embodiment of the present application; FIG. 1b is a top view of a thin film transistor of an array substrate in FIG. 1a; FIG. 1c is a cross-sectional view of the thin film transistor provided by the embodiment of the present application. With reference to FIGS. 1a and 1b, the embodiment of the present application provides an array substrate 100 including a plurality of pixel units 10 arranged in an array. Each of the pixel units 10 includes a thin film transistor 20. The thin film transistor 20 includes a gate electrode 21 and a drain electrode 22, wherein a first overlap region 201 and a non-overlap region 202 is disposed between the gate electrode 21 and the drain electrode 22, the first overlap region 201 is adjacent to the non-overlap region 202, and a width of a cross section of the drain electrode 22 in the first overlap region 201 is less than a width of a cross section of the drain electrode 22 in the non-overlap region 202.

The array substrate 100 of the present application reduces the area of the drain electrode 22 located in the first overlap region 201, namely an area of the drain electrode 22 right facing the gate electrode 21 to reduce a parasitic capacitor between the gate electrode 21 of the thin film transistor 20 and the drain electrode 22 and improve a display effect.

In the embodiment of the present application, with reference to FIG. 1a the array substrate 100 further includes a plurality of data lines 30 and a plurality of scan lines 40. Each of the pixel units 10 further includes pixel electrode 24. The thin film transistor 20 further includes source electrode 23. A source electrode 23 of the thin film transistor 20 is electrically connected to the data line 30. The gate electrode 21 of the thin film transistor 20 is electrically connected to the scan line 40. The drain electrode 22 of the thin film transistor 20 is electrically connected to the pixel electrode 24.

In the embodiment of the present application, a width of a cross section of the drain electrode 22 located in the first overlap region 201 gradually decreases along a direction away from the non-overlap region 202. Namely, a cross section of the drain electrode 22 of the first overlap region 201 is trapezoidal. Such design can narrow the width of the cross section of the drain electrode 22 located in the first overlap region 201, namely the overlap area of the gate electrode 21, under a condition guaranteeing the drain electrode 22 not ruptured, to further reduce a parasitic capacitor between the drain electrode 22 and the gate electrode 21 and improve a display effect.

In the embodiment of the present application, with reference to FIG. 1b, a second overlap region 203 is defined between the gate electrode 21 and the drain electrode 22. The second overlap region 203 is located on a side of in the first overlap region 201 away from the non-overlap region 202. A width of a cross section of the drain electrode 22 located in the second overlap region 203 is less than or equal to a width of the cross section of the drain electrode 22 located in the first overlap region 201. Furthermore, the width of the cross section of the drain electrode 22 located in the first overlap region 201 is less than the width of the cross section of the drain electrode 22 located in the non-overlap region 202. Such design guarantees a reduced overlap area between the drain electrode 22 and the gate electrode 21 under a condition guaranteeing the drain electrode 22 not ruptured to further reduce a parasitic capacitor between the drain electrode 22. Also, reduction of the area of the drain electrode 22 can decrease a light shielding effect of a metal layer in which the drain electrode 22 is located, decrease interference of the drain electrode 22 with lighting brightness of the pixel units 10, increase an aperture rate and transmittance of the array substrate 100, and improve a display effect.

It should be explained that a person of ordinary skill in the art, under a condition of guaranteeing no rupture or damage due to over thinness and guaranteeing normal conduction of the semiconductor can adjust a thickness of the gate electrode 21 according to actual demands. A thickness of the gate electrode 21 located in the first overlap region 201 is D1, a thickness of the gate electrode 21 located in the second overlap region 203 is D2, thicknesses of the gate electrode 21 and the drain electrode 22 in the non-overlap region are D3, and the thickness D1 of the gate electrode 21 located in the first overlap region 201 can be the same as or different from the thickness D2 of the gate electrode 21 located in the second overlap region 203, with reference to FIG. 1c, the thickness D1 of the gate electrode 21 located in the first overlap region 201 is less than the thickness D2 of the gate electrode 21 located in the second overlap region 203, the thicknesses of the gate electrode 21 and the drain electrode 22 in the non-overlap region are D3 is greater than the thickness D2 of the gate electrode 21 located in the second overlap region 203, i.e., D3>D2>D1. In particular, the thickness D1 of the gate electrode 21 located in the first overlap region 201 can also be equal to the thickness D2 of the gate electrode 21 located in the second overlap region 203, and the thickness D1 of the gate electrode 21 located in the first overlap region 201 and the thickness D2 of the gate electrode 21 located in the second overlap region 203 are less than the thickness D3 of the gate electrode 21 located in the non-overlap region of the drain electrode 22, namely, D3>D2, D2=D1.

With reference to FIG. 1c, the thickness H3 of the drain electrode 22 located in the non-overlap region 202 is greater than the thickness H1 of the drain electrode 22 located in the first overlap region 201. The thickness H1 of the drain electrode 22 located in the first overlap region 201 is greater than the thickness H2 of the drain electrode 22 located in the second overlap region 203. In particular, the thickness H1 of the drain electrode 22 located in the first overlap region 201 can also be equal to the thickness H2 of the drain electrode 22 located in the second overlap region 203. Such design increases a distance between the drain electrode 22 located in the first overlap region 201 the drain electrode 22 located in the second overlap region 203 and the corresponding gate electrode 21 located in the first overlap region 201/second overlap region 203, the parasitic capacitor can be further reduced, which advantages improvement of high resolution of the array substrate 100 and the aperture rate, and improves a display effect.

The array substrate 100 of the present application reduces the area of the drain electrode 22 in the overlap region between the drain electrode 22 and the gate electrode 21, lowers a thickness of the gate electrode 21 in the overlap region of the gate electrode 21 and the drain electrode 22 overlap region, reduces a parasitic capacitor between the gate electrode 21 and the drain electrode 22, and increases an aperture rate and transmittance of the array substrate 100, and improve a display effect.

Figure 2A:
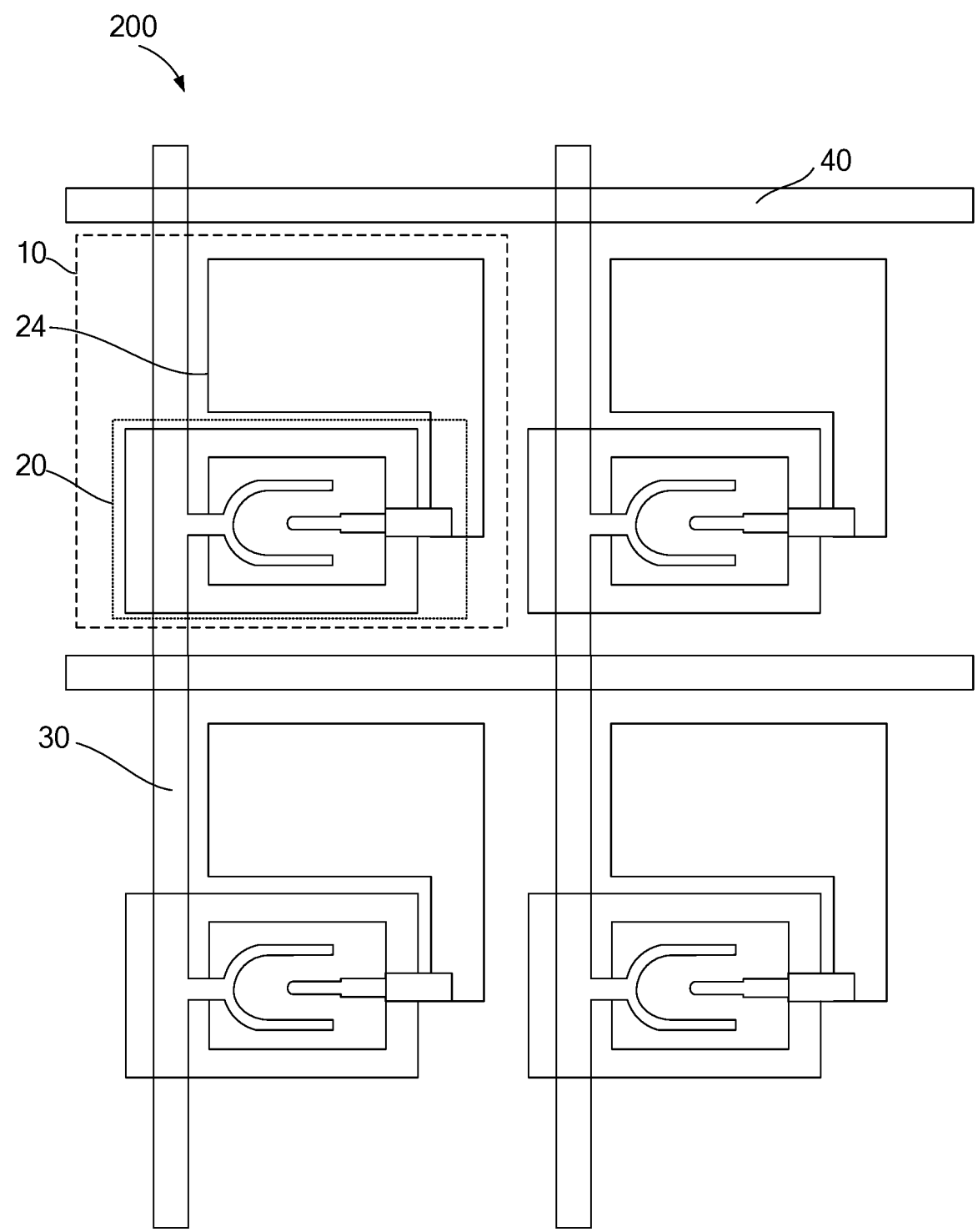
FIG. 2a is a top view of a second array substrate provided by the embodiment of the present application.
Figure 2B:
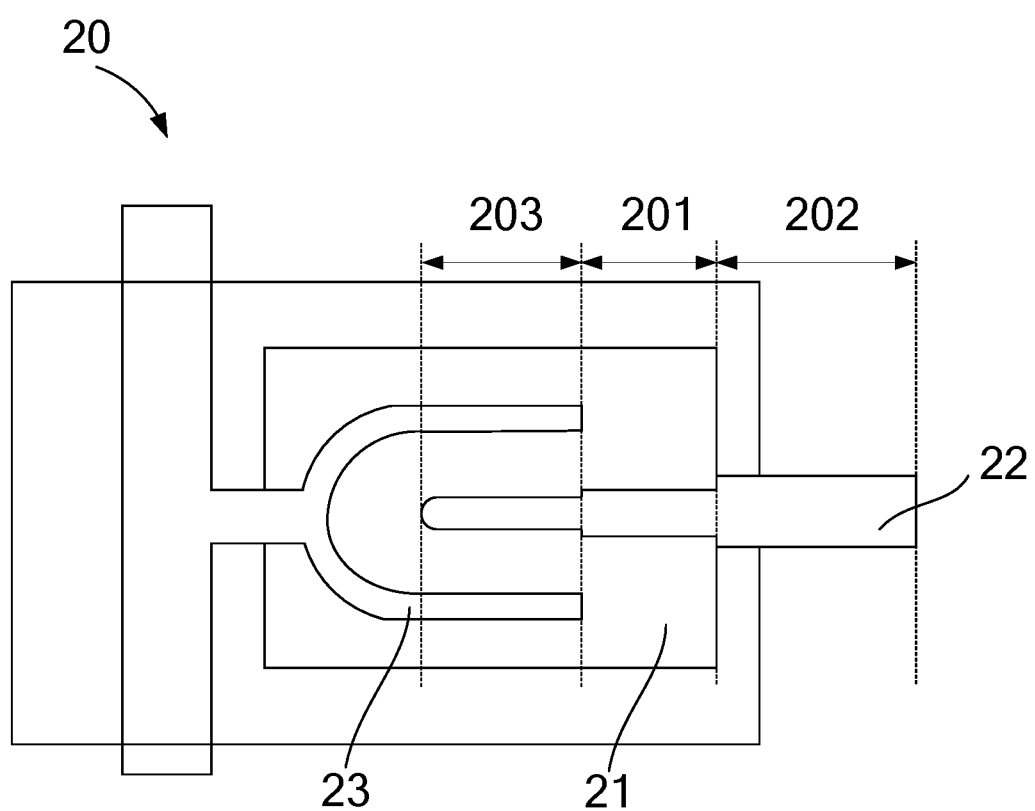

As another embodiment of the present application, with reference to FIGS. 2a and 2b, FIG. 2a is a top view of a second array substrate provided by the embodiment of the present application; FIG. 2b is a top view of the thin film transistor 20 of the array substrate in FIG. 2a. With reference to FIGS. 2a and 2b, the present application provides an array substrate 200, a distinguishing feature of the array substrate 200 compared to the array substrate 100 is that: a cross section of the drain electrode 22 located in the first overlap region 201 is square.

In the embodiment of the present application, the thin film transistor 20 in the array substrate 200 includes a gate electrode 21 and a drain electrode 22. A first overlap region 201 and a non-overlap region 202 are defined between the gate electrode 21 and the drain electrode 22. The first overlap region 201 is located adjacent to the non-overlap region 202. The width of the cross section of the drain electrode 22 located in the first overlap region 201 is less than the width of the cross section of the drain electrode 22 located in the non-overlap region 202.

In the embodiment of the present application, the array substrate 200 as shown in FIG. 2a further includes a plurality of data lines 30 and a plurality of scan lines 40. Each of the pixel units 10 further includes pixel electrode 24. The thin film transistor 20 further includes a source electrode 23. The source electrode 23 of the thin film transistor 20 is electrically connected to the data line 30. The gate electrode 21 of the thin film transistor 20 is electrically connected to the scan lines 40. The drain electrode 22 of the thin film transistor 20 is electrically connected to the pixel electrode 24.

In the embodiment of the present application, a second overlap region 203 is defined between the gate electrode 21 and the drain electrode 22. The second overlap region 203 is located on a side of in the first overlap region 201 away from the non-overlap region 202. A width of a cross section of the drain electrode 22 located in the second overlap region 203 is less than or equal to a width of the cross section of the drain electrode 22 located in the first overlap region 201. Furthermore, the width of the cross section of the drain electrode 22 located in the first overlap region 201 is less than the width of the cross section of the drain electrode 22 located in the non-overlap region 202. Such design guarantees a reduced overlap area between the drain electrode 22 and the gate electrode 21 under a condition guaranteeing the drain electrode 22 not ruptured to further reduce a parasitic capacitor between the drain electrode 22. Also, reduction of the area of the drain electrode 22 can decrease a light shielding effect of a metal layer in which the drain electrode 22 is located, decrease interference of the drain electrode 22 with lighting brightness of the pixel units 10, increase an aperture rate and of transmittance of the array substrate 200, and improve a display effect.

The array substrate 200 provided by the present application, compared to the array substrate 100, further decreases the overlap area between the drain electrode 22 and the gate electrode 21 to further reduce a parasitic capacitor between the drain electrode 22 and the gate electrode 21. Also, reduction of the area decreases interference of the drain electrode 22 with lighting brightness of the pixel units 10, increases an aperture rate and a transmittance of the array substrate 200, and increases a display effect.

Figure 3A:
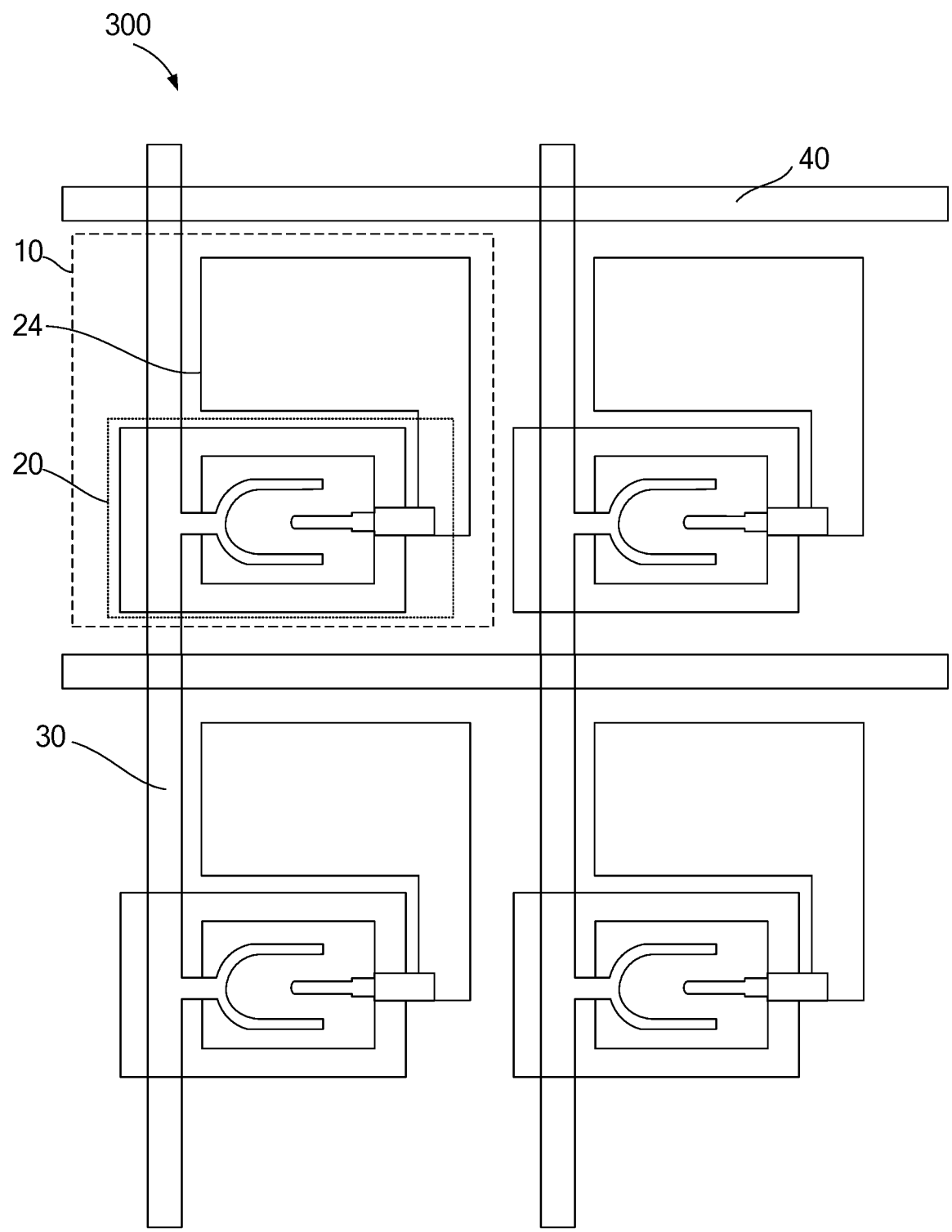
FIG. 3a is a top view of a third array substrate provided by the embodiment of the present application.
Figure 3B:
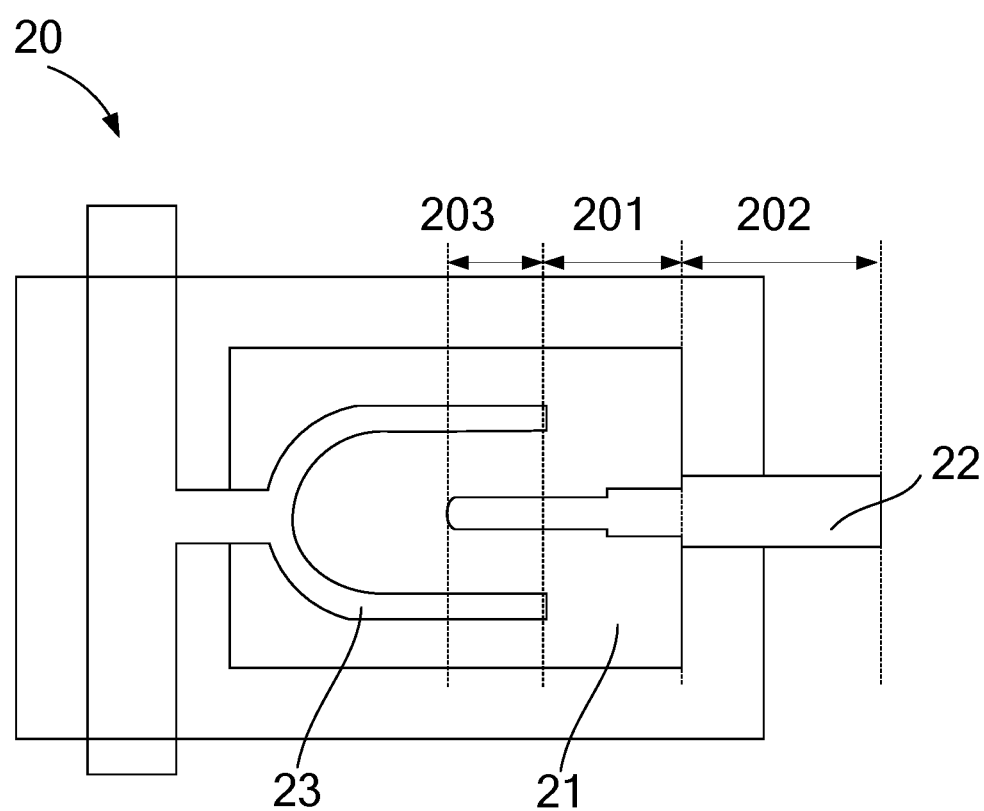

As a specific embodiment of the present application, with reference to FIGS. 3a and 3b, FIG. 3a is a top view of a third array substrate provided by the embodiment of the present application; FIG. 3b is a top view of the thin film transistor 20 of the array substrate in FIG. 3a. With reference to FIGS. 3a and 3b, the present application provides an array substrate 300, a distinguishing feature of the array substrate 300 from the array substrate 100 is that: an area of the drain electrode 22 located in the second overlap region 203 is less than the area of the drain electrode 22 located in the first overlap region 201. In particular, the drain electrode 22 located in the first overlap region 201 is two-step narrowed along a direction away from the non-overlap region 202. Optionally, the narrowing can also be three-step, four-step, or multi-step.

In the embodiment of the present application, the thin film transistor 20 in the array substrate 300 includes a gate electrode 21 and a drain electrode 22. A first overlap region 201 and a non-overlap region 202 are defined between the gate electrode 21 and the drain electrode 22. The first overlap region 201 is located adjacent to the non-overlap region 202. The width of the cross section of the drain electrode 22 located in the first overlap region 201 is less than the width of the cross section of the drain electrode 22 located in the non-overlap region 202.

In the embodiment of the present application, the array substrate 300 as shown in FIG. 3a further includes a plurality of data lines 30 and a plurality of scan lines 40. Each of the pixel units 10 further includes pixel electrode 24. The thin film transistor 20 further includes a source electrode 23. The source electrode 23 of the thin film transistor 20 is electrically connected to the data line 30. The gate electrode 21 of the thin film transistor 20 is electrically connected to the scan lines 40. The drain electrode 22 of the thin film transistor 20 is electrically connected to the pixel electrode 24.

In the embodiment of the present application, a second overlap region 203 is defined between the gate electrode 21 and the drain electrode 22. The second overlap region 203 is located on a side of in the first overlap region 201 away from the non-overlap region 202. A width of a cross section of the drain electrode 22 located in the second overlap region 203 is less than or equal to a width of the cross section of the drain electrode 22 located in the first overlap region 201. Furthermore, the width of the cross section of the drain electrode 22 located in the first overlap region 201 is less than the width of the cross section of the drain electrode 22 located in the non-overlap region 202. Such design guarantees a reduced overlap area between the drain electrode 22 and the gate electrode 21 under a condition guaranteeing the drain electrode 22 not ruptured to further reduce a parasitic capacitor between the drain electrode 22. Also, reduction of the area of the drain electrode 22 can decrease a light shielding effect of a metal layer in which the drain electrode 22 is located, decrease interference of the drain electrode 22 with lighting brightness of the pixel units 10, increase an aperture rate and of the array substrate 300, and improve a display effect.

The array substrate 300 provided by the present application, compared to the array substrate 100, further decreases the overlap area between the drain electrode 22 and the gate electrode 21 to further reduce a parasitic capacitor between the drain electrode 22 and the gate electrode 21. Also, reduction of the area decreases interference of the drain electrode 22 with lighting brightness of the pixel units 10, and increases an aperture rate and of the array substrate 300, and improves a display effect.

Figure 4A:
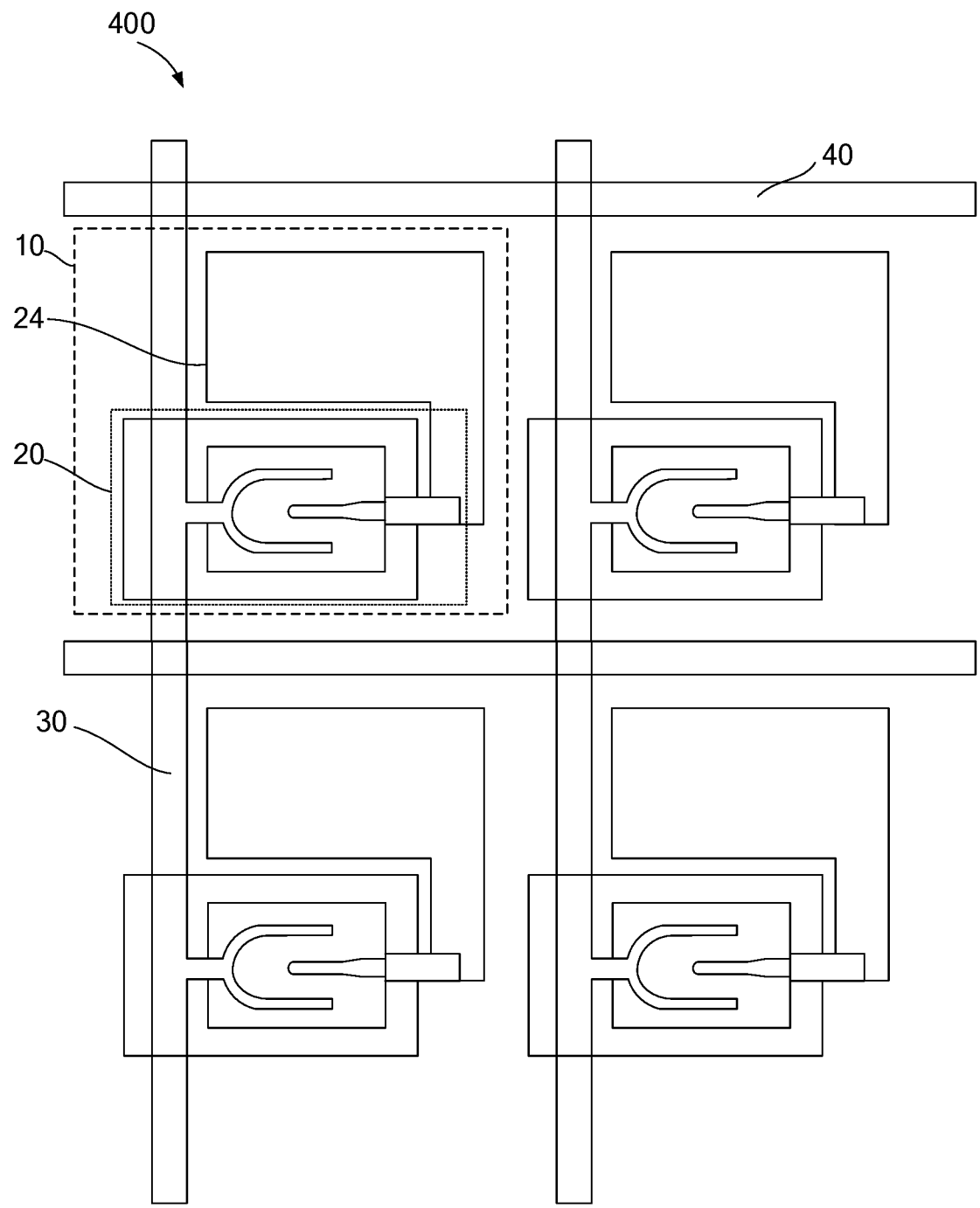
FIG. 4a is a top view of a fourth array substrate provided by the embodiment of the present application.
Figure 4B:
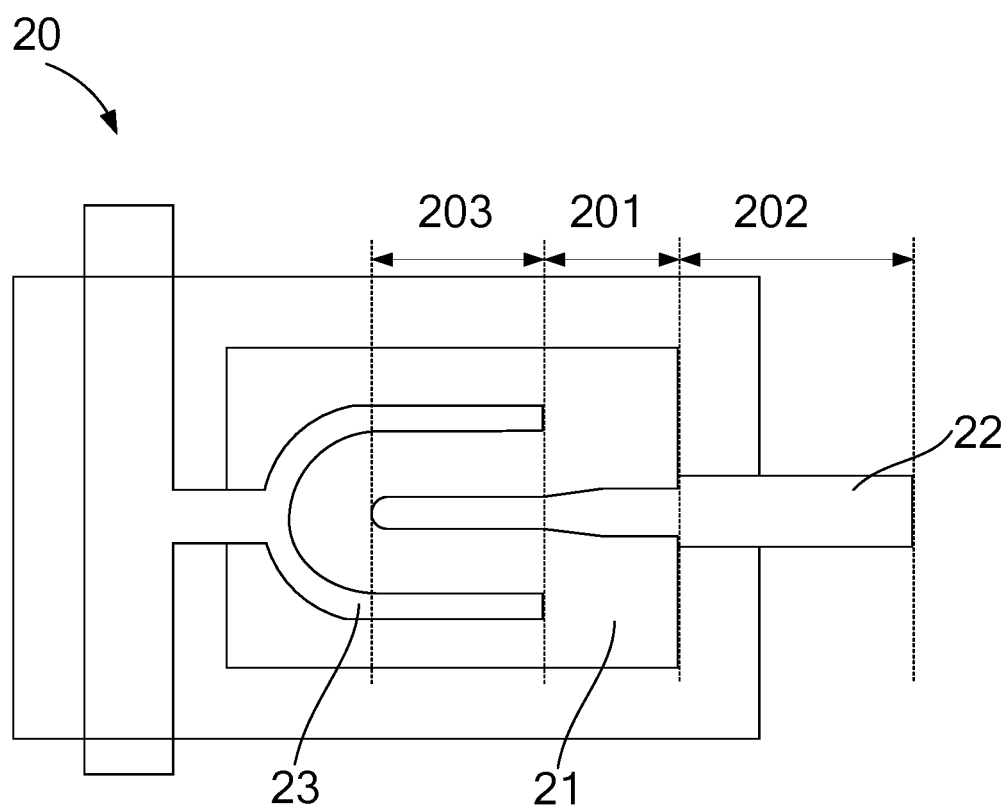

As a specific embodiment of the present application, with reference to FIGS. 4a and 4b, FIG. 4a is a top view of a fourth array substrate provided by the embodiment of the present application; FIG. 4b is the top view of a thin film transistor 20 of the array substrate in FIG. 4a. With reference to FIGS. 4a and 4b, the present application provides an array substrate 400, a distinguishing feature of the array substrate 400 compared to the array substrate 100 is that: a length of the cross section of the drain electrode 22 located in the non-overlap region 202 is greater than a length of the cross section the drain electrode 22 located in the first overlap region 201, and/or, a length of the cross section of the drain electrode 22 located in the non-overlap region 202 is greater than a length of the cross section of the drain electrode 22 located in the second overlap region 203.

In the embodiment of the present application, the thin film transistor 20 in the array substrate 400 includes a gate electrode 21 and a drain electrode 22. A first overlap region 201 and a non-overlap region 202 are defined between the gate electrode 21 and the drain electrode 22. The first overlap region 201 is located adjacent to the non-overlap region 202. The width of the cross section of the drain electrode 22 located in the first overlap region 201 is less than the width of the cross section of the drain electrode 22 located in the non-overlap region 202.

In the embodiment of the present application, the array substrate 400 as shown in FIG. 4a further includes a plurality of data lines 30 and a plurality of scan lines 40. Each of the pixel units 10 further includes pixel electrode 24. The thin film transistor 20 further includes a source electrode 23. The source electrode 23 of the thin film transistor 20 is electrically connected to the data line 30. The gate electrode 21 of the thin film transistor 20 is electrically connected to the scan lines 40. The drain electrode 22 of the thin film transistor 20 is electrically connected to the pixel electrode 24.

In the embodiment of the present application, preferably, the length of the cross section of the drain electrode 22 located in the non-overlap region 202 is greater than the length of the cross section of the drain electrode 22 located in the first overlap region 201 and the length of the cross section of the drain electrode 22 located in the second overlap region 203. The length of the cross section of the drain electrode 22 located in the first overlap region 201 is unequal to the length of the cross section of the drain electrode 22 located in the second overlap region 203.

In the embodiment of the present application, a second overlap region 203 is defined between the gate electrode 21 and the drain electrode 22. The second overlap region 203 is located on a side of in the first overlap region 201 away from the non-overlap region 202. A width of a cross section of the drain electrode 22 located in the second overlap region 203 is less than or equal to a width of the cross section of the drain electrode 22 located in the first overlap region 201. Furthermore, the width of the cross section of the drain electrode 22 located in the first overlap region 201 is less than the width of the cross section of the drain electrode 22 located in the non-overlap region 202. Such design guarantees a reduced overlap area between the drain electrode 22 and the gate electrode 21 under a condition guaranteeing the drain electrode 22 not ruptured to further reduce a parasitic capacitor between the drain electrode 22. Also, reduction of the area of the drain electrode 22 can decrease a light shielding effect of a metal layer in which the drain electrode 22 is located, decrease interference of the drain electrode 22 with lighting brightness of the pixel units 10, increase an aperture rate and a transmittance of the array substrate 400, and improve a display effect.

Figure 5A:
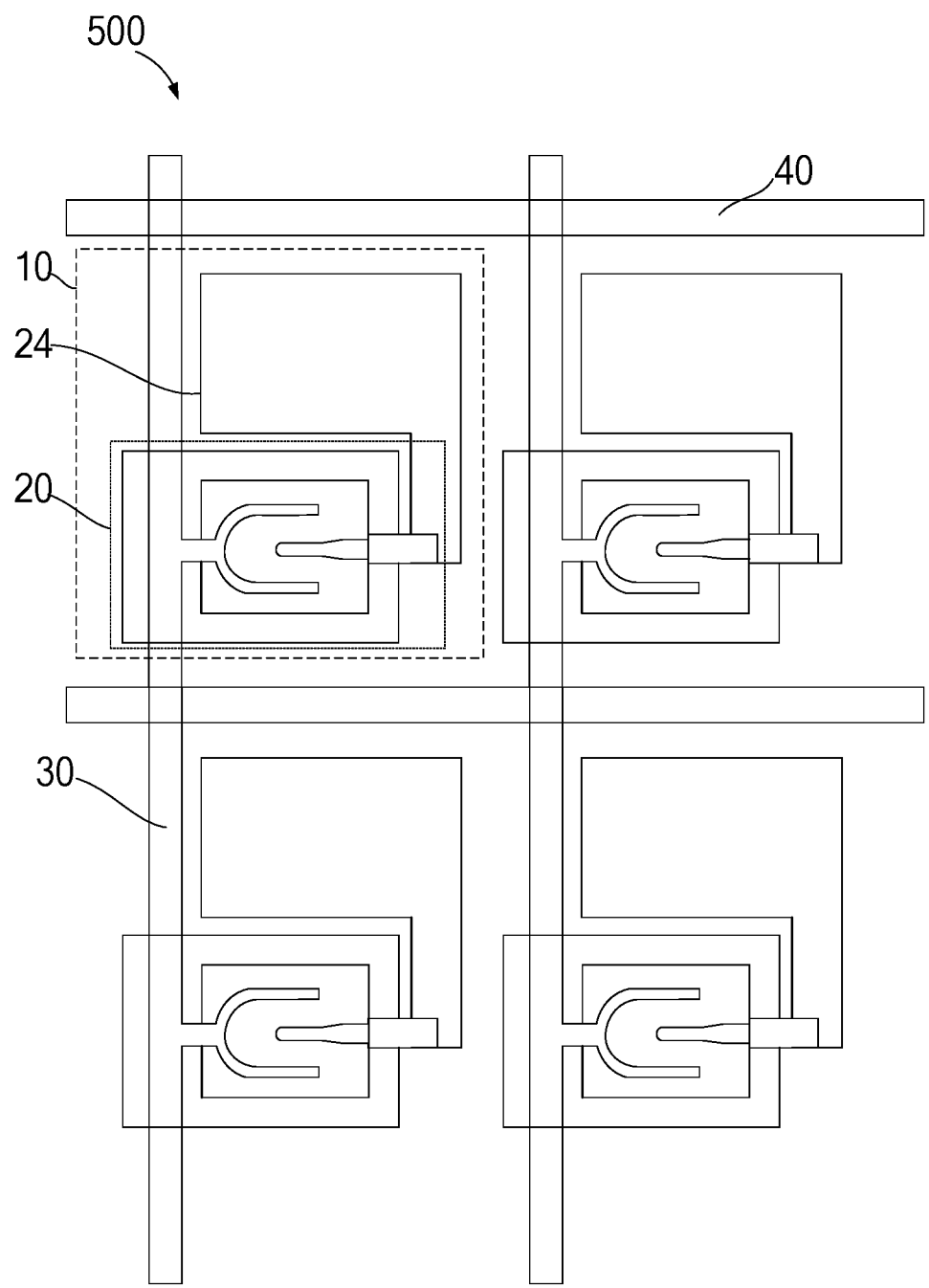
FIG. 5a is a top view of a fifth array substrate provided by the embodiment of the present application.
Figure 5B:
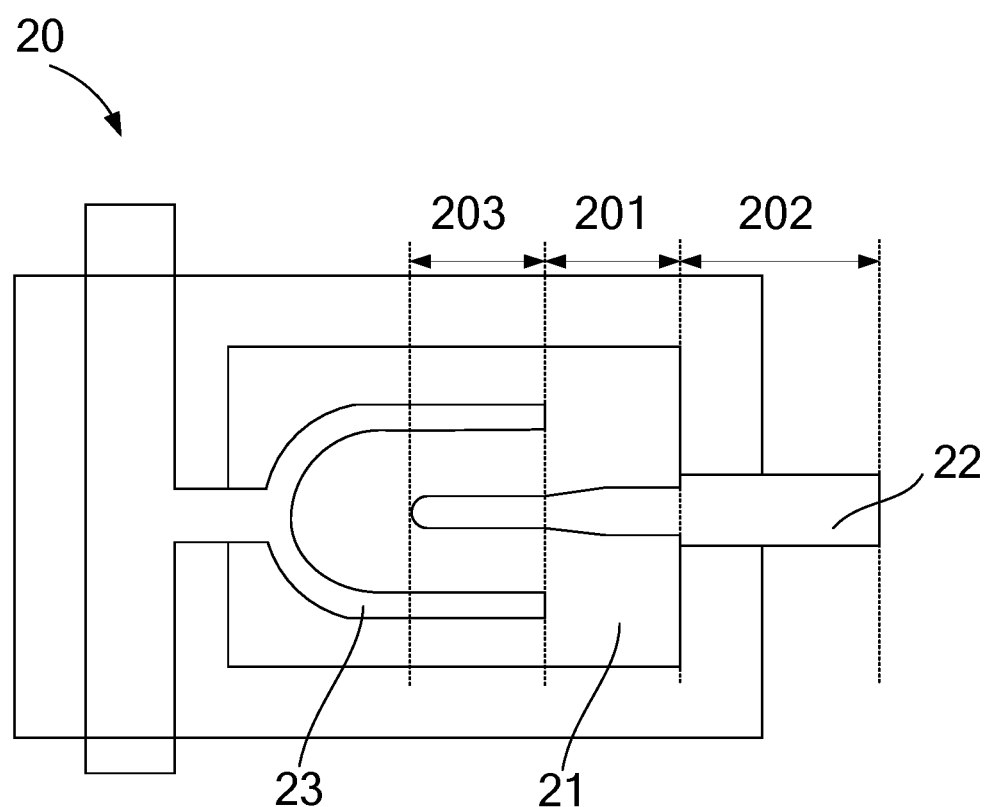

As a specific embodiment of the present application, with reference to FIGS. 5a and 5b, FIG. 5a is a top view of a fifth array substrate provided by the embodiment of the present application; FIG. 5b is a top view of the thin film transistor 20 of the array substrate in FIG. 5a. With reference to FIGS. 5a and 5b, the present application provides an array substrate 500, a distinguish feature of the array substrate 500 compared to the array substrate 100 is that: the length of the cross section of the drain electrode 22 located in the non-overlap region 202 is equal to the length of the cross section of the drain electrode 22 located in the first overlap region 201 and the length of the cross section of the drain electrode 22 located in the second overlap region 203.

In the embodiment of the present application, the thin film transistor 20 in the array substrate 500 includes a gate electrode 21 and a drain electrode 22. A first overlap region 201 and a non-overlap region 202 are defined between the gate electrode 21 and the drain electrode 22. The first overlap region 201 is located adjacent to the non-overlap region 202. The width of the cross section of the drain electrode 22 located in the first overlap region 201 is less than the width of the cross section of the drain electrode 22 located in the non-overlap region 202.

In the embodiment of the present application, the array substrate 500 as shown in FIG. 5a further includes a plurality of data lines 30 and a plurality of scan lines 40. Each of the pixel units 10 further includes pixel electrode 24. The thin film transistor 20 further includes a source electrode 23. The source electrode 23 of the thin film transistor 20 is electrically connected to the data line 30. The gate electrode 21 of the thin film transistor 20 is electrically connected to the scan lines 40. The drain electrode 22 of the thin film transistor 20 is electrically connected to the pixel electrode 24.

In the embodiment of the present application, a second overlap region 203 is defined between the gate electrode 21 and the drain electrode 22. The second overlap region 203 is located on a side of in the first overlap region 201 away from the non-overlap region 202. A width of a cross section of the drain electrode 22 located in the second overlap region 203 is less than or equal to a width of the cross section of the drain electrode 22 located in the first overlap region 201. Furthermore, the width of the cross section of the drain electrode 22 located in the first overlap region 201 is less than the width of the cross section of the drain electrode 22 located in the non-overlap region 202. Such design guarantees a reduced overlap area between the drain electrode 22 and the gate electrode 21 under a condition guaranteeing the drain electrode 22 not ruptured to further reduce a parasitic capacitor between the drain electrode 22. Also, reduction of the area of the drain electrode 22 can decrease a light shielding effect of a metal layer in which the drain electrode 22 is located, decrease interference of the drain electrode 22 with lighting brightness of the pixel units 10, improve an aperture rate and a transmittance of the array substrate 500, and improve a display effect.

Figure 6:
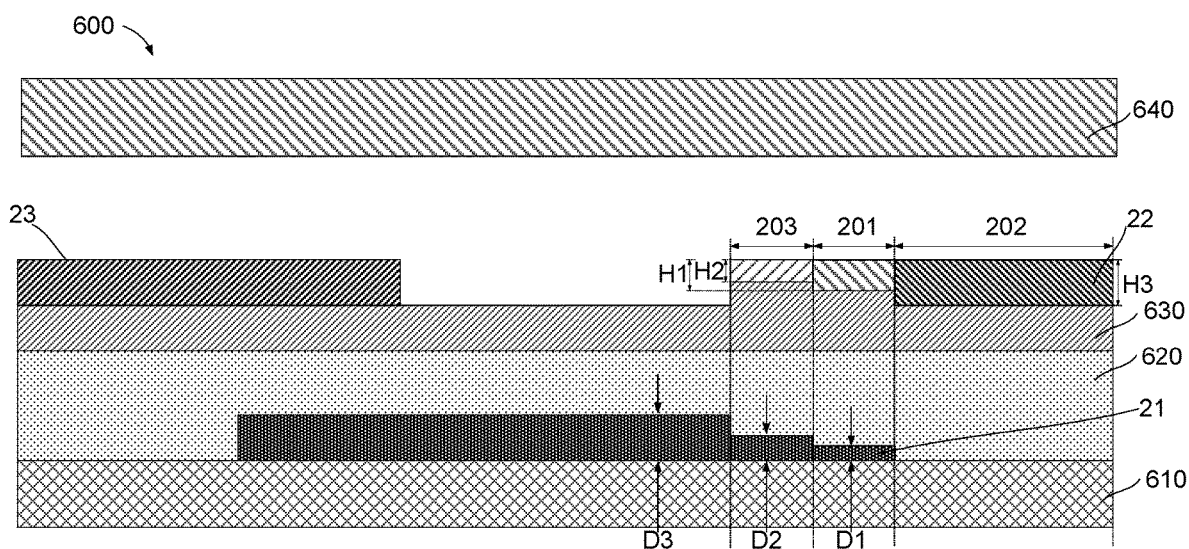
FIG. 6 is a cross-sectional view of the display panel provided by the embodiment of the present application.

With reference to FIG. 6, FIG. 6 is a cross-sectional view of the display panel provided by the embodiment of the present application. With reference to FIG. 6, the present application provides a display panel 600, includes a color filter substrate 640 and the above array substrate, array substrate further includes an underlay substrate 610.

In the embodiment of the present application, a material of the underlay substrate 610 can be glass, quartz, organic polymer, or opaque/reflective material (for example: a conductive material, wafer, ceramic, or other suitable material), or other suitable material.

In the embodiment of the present application, display panel 600 further includes a gate electrode 21, a gate electrode insulation layer 620, a semiconductor layer 630, a source electrode 23, and a drain electrode 22. The gate electrode 21 is disposed on the underlay substrate 610. The gate electrode insulation layer 620 covers the gate electrode 21. The semiconductor layer 630 is disposed on the gate electrode insulation layer 620. The source electrode 23 and the drain electrode 22 is disposed on the semiconductor layer 630 in the same layer.

In the embodiment of the present application, a first overlap region 201 and a second overlap region 203 are defined between the gate electrode 21 and the drain electrode 22. second overlap region 203 located on a side of the first overlap region 201 away from the non-overlap region 202. A width of a cross section of the drain electrode 22 located in the second overlap region 203 is less than or equal to a width of the cross section of the drain electrode 22 located in the first overlap region 201. Furthermore, the width of the cross section of the drain electrode 22 located in the first overlap region 201 is less than the width of the cross section of the drain electrode 22 located in the non-overlap region 202. Such design guarantees a reduced overlap area between the drain electrode 22 and the gate electrode 21 under a condition guaranteeing the drain electrode 22 not ruptured to further reduce a parasitic capacitor between the drain electrode 22. Also, reduction of the area of the drain electrode 22 can decrease a light shielding effect of a metal layer in which the drain electrode 22 is located, decrease interference of the drain electrode 22 with lighting brightness of the pixel units 10, increase an aperture rate and a transmittance of the array substrate, and improve a display effect.

It should be explained that the a person of ordinary skill in the art, under a condition of guaranteeing no rupture or damage due to over thinness and guaranteeing normal conduction of the semiconductor, can adjust the thickness of the gate electrode 21 according to actual demands. A thickness of the gate electrode 21 located in the first overlap region 201 is D1, a thickness of the gate electrode 21 located in the second overlap region 203 is D2, the thicknesses of the gate electrode 21 and the drain electrode 22 in the non-gate overlap region are D3, and the thickness D1 of the gate electrode 21 located in the first overlap region 201 can be the same as or different from the thickness D2 of the gate electrode 21 located in the second overlap region 203. With reference to FIG. 6, the thickness D1 of the gate electrode 21 located in the first overlap region 201 is less than the thickness D2 of the gate electrode 21 located in the second overlap region 203, the thicknesses of the gate electrode 21 and the drain electrode 22 in the non-overlap region are D3 is greater than the thickness D2 of the gate electrode 21 located in the second overlap region 203, i.e., D3>D2>D1. In particular, the thickness D1 of the gate electrode 21 located in the first overlap region 201 can also be equal to the thickness D2 of the gate electrode 21 located in the second overlap region 203, and the thickness D1 of the gate electrode 21 located in the first overlap region 201 and the thickness D2 of the gate electrode 21 located in the second overlap region 203 are less than the thickness D3 of the gate electrode 21 located in the non-overlap region of the drain electrode 22, namely, D3>D2, D2=D1.

With reference to FIG. 6, the thickness H3 of the drain electrode 22 located in the non-overlap region 202 is greater than the thickness H1 of the drain electrode 22 located in the first overlap region 201. The thickness H1 of the drain electrode 22 located in the first overlap region 201 is greater than the thickness H2 of the drain electrode 22 located in the second overlap region 203. In particular, the thickness H1 of the drain electrode 22 located in the first overlap region 201 can also be equal to the thickness H2 of the drain electrode 22 located in the second overlap region 203. Such design increases a distance between the drain electrode 22 located in the first overlap region 201 the drain electrode 22 located in the second overlap region 203 and the corresponding gate electrode 21 located in the first overlap region 201/second overlap region 203, the parasitic capacitor can be further reduced, which advantages improvement of high resolution of the array substrate 100 and the aperture rate, and improves a display effect.

The present application provides an array substrate and a display panel. The array substrate includes a plurality of pixel units 10 arranged in an array, each of the pixel units 10 includes a thin film transistor 20. The thin film transistor 20 includes a gate electrode 21 and a drain electrode 22, wherein a first overlap region 201 and a non-overlap region 202 are defined between the gate electrode 21 and the drain electrode 22, the first overlap region 201 is adjacent to the non-overlap region 202, and an area of the drain electrode 22 in the first overlap region 201 is less than an area of the drain electrode 22 in the non-overlap region 202. The array substrate of the present application reduces the area of the drain electrode 22 located in the first overlap region 201, i.e., the area of the drain electrode 22 right facing the gate electrode 21 to reduce a parasitic capacitor between the gate electrode 21 and the drain electrode 22 of the thin film transistor 20. Also, the thickness D1 of the gate electrode 21 located in the first overlap region 201 is lowered such that a distance between the gate electrode 21 located in the first overlap region 201 and the drain electrode 22 increases to further reduce a parasitic capacitor between the gate electrode 21 and the drain electrode 22 of the thin film transistor 20 to improve display effect.

The array substrate and the display panel provided by the embodiment of the present application are described in detail as above. In the specification, the specific examples are used to explain the principle and embodiment of the present application. The above description of the embodiments is only used to help understand the method of the present application and its spiritual idea. Meanwhile, for those skilled in the art, according to the present idea of invention, changes will be made in specific embodiment and application. In summary, the contents of this specification should not be construed as limiting the present application.

What is claimed is:

1. An array substrate, comprising a plurality of pixel units arranged in an array, wherein each of the pixel units comprises a thin film transistor, and the thin film transistor comprises a gate electrode and a drain electrode; and wherein a first overlap region and a non-overlap region are defined between the gate electrode and the drain electrode, the first overlap region is located adjacent to the non-overlap region, and a width of a cross section of the drain electrode located in the first overlap region is less than a width of a cross section of the drain electrode located in the non-overlap region;

wherein a second overlap region is defined between the gate electrode and the drain electrode, and the second overlap region is located on a side of the first overlap region away from the non-overlap region;

wherein a thickness of the gate electrode located in the first overlap region is less than a thickness of the gate electrode located in the second overlap region.

2. The array substrate according to claim 1, wherein a width of a cross section of the drain electrode located in the second overlap region is less than or equal to a width of the cross section of the drain electrode located in the first overlap region.

3. The array substrate according to claim 2, wherein the width of the cross section of the drain electrode located in the first overlap region is less than a width of the cross section of the drain electrode located in the non-overlap region.

4. The array substrate according to claim 3, wherein the width of the cross section of the drain electrode located in the first overlap region gradually decreases along a direction away from the non-overlap region.

5. The array substrate according to claim 3, wherein the cross section of the drain electrode located in the first overlap region is square.

6. The array substrate according to claim 3, wherein an area of the drain electrode located in the second overlap region is less than the area of the drain electrode located in the first overlap region.

7. The array substrate according to claim 3, wherein a length of the cross section of the drain electrode located in the non-overlap region is greater than a length of the cross section of the drain electrode located in the first overlap region, or the length of the cross section of the drain electrode located in the non-overlap region is greater than a length of the cross section of the drain electrode located in the second overlap region.

8. The array substrate according to claim 3, wherein a length of the cross section of the drain electrode located in the first overlap region is equal to a length of the cross section of the drain electrode located in the second overlap region.

9. The array substrate according to claim 3, wherein a thickness of the drain electrode located in the first overlap region is greater than a thickness of the drain electrode located in the second overlap region.

10. A display panel, comprising a color filter substrate and an array substrate, wherein the color filter substrate and the array substrate are disposed oppositely, the array substrate comprises a plurality of pixel units arranged in an array, each of the pixel units comprises a thin film transistor, and the thin film transistor comprises a gate electrode and a drain electrode; and wherein a first overlap region and a non-overlap region are defined between the gate electrode and the drain electrode, the first overlap region is located adjacent to the non-overlap region, and a width of a cross section of the drain electrode located in the first overlap region is less than a width of a cross section of the drain electrode located in the non-overlap region;

wherein a second overlap region is defined between the gate electrode and the drain electrode, and the second overlap region is located on a side of the first overlap region away from the non-overlap region;

wherein a thickness of the gate electrode located in the first overlap region is less than a thickness of the gate electrode located in the second overlap region.

11. The display panel according to claim 10, wherein a width of a cross section of the drain electrode located in the second overlap region is less than or equal to the width of the cross section of the drain electrode located in the first overlap region.

12. The display panel according to claim 11, wherein the width of the cross section of the drain electrode located in the first overlap region is less than the width of the cross section of the drain electrode located in the non-overlap region.

13. The display panel according to claim 12, wherein the width of the cross section of the drain electrode located in the first overlap region gradually decreases along a direction away from the non-overlap region.

14. The display panel according to claim 12, wherein the cross section of the drain electrode located in the first overlap region is square.

15. The display panel according to claim 12, wherein an area of the drain electrode located in the second overlap region is less than the area of the drain electrode located in the first overlap region.

16. The display panel according to claim 12, wherein a length of the cross section of the drain electrode located in the non-overlap region is greater than a length of the cross section of the drain electrode located in the first overlap region, or, the length of the cross section of the drain electrode located in the non-overlap region is greater than a length of the cross section of the drain electrode located in the second overlap region.

17. The display panel according to claim 12, wherein a length of the cross section of the drain electrode located in the first overlap region is equal to a length of the cross section of the drain electrode located in the second overlap region.

18. An array substrate, comprising a plurality of pixel units arranged in an array, wherein each of the pixel units comprises a thin film transistor, and the thin film transistor comprises a gate electrode and a drain electrode; and wherein a first overlap region and a non-overlap region are defined between the gate electrode and the drain electrode, the first overlap region is located adjacent to the non-overlap region, and a width of a cross section of the drain electrode located in the first overlap region is less than a width of a cross section of the drain electrode located in the non-overlap region;

wherein a second overlap region is defined between the gate electrode and the drain electrode, and the second overlap region is located on a side of the first overlap region away from the non-overlap region;

wherein a width of a cross section of the drain electrode located in the second overlap region is less than or equal to a width of the cross section of the drain electrode located in the first overlap region;

wherein the width of the cross section of the drain electrode located in the first overlap region is less than a width of the cross section of the drain electrode located in the non-overlap region;

wherein a thickness of the drain electrode located in the first overlap region is greater than a thickness of the drain electrode located in the second overlap region.

* * * * *